AMPLIFIER WITH A HIGH INPUT RESISTANCE

Filed March 8, 1965

Inventors
Siegfried Büsch
Reimar Germann
Robert Kolitsch
By Watson Cole Grindle & Watson
Attys.

Inventors
Siegfried Büsch
Reimar Germann
Robert Kolitsch
By Watson, Cole, Grindle & Watson
Attys.

United States Patent Office 3,452,287
Patented June 24, 1969

3,452,287

AMPLIFIER WITH A HIGH INPUT RESISTANCE

Siegfried Büsch and Reimar Germann, Graz, and Robert Kolitsch, Graz-Puntigam, Austria, assignors to Hans List, Graz, Austria Filed Mar. 8, 1965, Ser. No. 437,712
Claims priority, application Austria, Mar. 9, 1964, A 2,037/64
Int. Cl. H03f 3/18, 3/04, 3/14
U.S. Cl. 330—17 4 Claims

ABSTRACT OF THE DISCLOSURE

High input impedance transistor amplifiers for amplifying outputs of piezoelectric measuring devices. A grounded drain, insulated gate, field-effect transistor is used in the input stage and is followed by one or more transistor amplifying stages; an auxiliary transistor stage having a temperature and voltage sensitive load resistance may be connected with the field-effect transistor to provide temperature and drift compensation.

Figure 1:
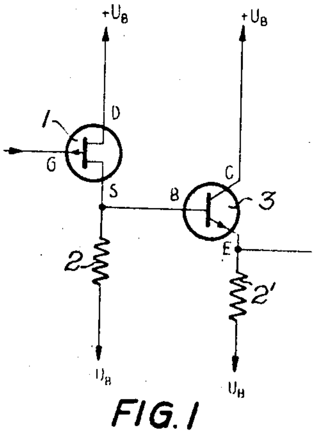

The invention relates to an amplifier with a high input resistance, particularly for the amplification of values measured by piezoelectric measuring instruments, comprising an input stage formed by a field-effect transistor in a grounded drain arrangement, the load resistor of which is connected to the source of the transistor and a transistor stage with a high input resistance following the input stage. For measurements by means of piezoelectric gauges, further processing of data generally requires considerable amplification of the electrical values thus measured. In order to achieve the required degree of amplification, the amplifiers used for the purpose should meet particularly exacting requirements with regard to linearity, constancy of amplification and frequency range. In order for the current supplied by the piezoelectric gauge to be measurable, the input resistance of the amplifier in particular, should be extremely high, especially where static calibration of the piezoelectric gauge is required. The overall input resistance is determined chiefly by the input resistance of the first amplifier element added to the dielectric resistance of the gauge, lead cables and capacitors.

Amplifiers having a high input resistance are already known per se. One of these conventional amplifiers uses electrometer tubes as the first amplifier element. However, these have certain drawbacks which reduce or completely nullify their usefulness for certain applications. For example, special precautions are necessary to protect the delicate electrometer tubes against shocks and light. Furthermore, the comparatively large space required for the accommodation of electrometer tubes and their connectors precludes their use in miniature amplifiers of the type used in geological deep-well drilling or for the electrical equipment of aircraft and rockets. Nor is it possible with the use of electrometer tubes to meet certain specifications calling for a high frequency range and a short rise time in the presence of considerably fluctuating measurement results as in the case of detonations.

In a conventional transistorized amplifier of the type hereabove described the emitter of the transistor of the grounded collector stage is connected with the base of the transistor of the following grounded emitter stage in order to protect the transistors against input signals exceeding the admissible input level, the load resistance of the grounded emitter usage being such as to produce a voltage drop approximately equal to the admissible maximum voltage between the base and the emitter. However, the temperature drift occurring with this amplifier is objectionable so that this conventional type is suitable for the above mentioned application to a limited extent only.

It is the object of the present invention to eliminate the drawbacks of conventional types of amplifiers by providing an amplifier meeting the above-mentioned requirements to a considerable degree. According to the invention, this is achieved by the use of a field-effect transistor comprising one or a plurality of gates for the input stage, the drain of the said transistor being directly connected with the positive feed voltage, and by connecting the second gate of the field-effect transistor with the first portion of the bipartite load resistance of an auxiliary stage connected to the output of the field-effect transistor, the said auxiliary stage consisting of a transistor operated in a grounded collector ararngement, the load resistance being dependent on temperature and/or voltage. On the one hand, this design of the amplifier provides the possibility of a reaction-free setting of the operating point of the field-effect transistor, and on the other hand, maximum temperature and drift compensation due to the fact that resistance is dependent on temperature and voltage. Since the above-mentioned load resistances are moreover, traversed by current which is proportionate to the input value, reinforced compensation occurs also when an unfavorable temperature drift prevails due to an increase of the current load of the input transistor.

According to another feature of the invention, a voltage-amplifying transistor stage can be connected to the transistor stage following the input stage, preferably with the interposition of one or a plurality of amplifier stages in a grounded emitter arrangement, the base of the said voltage-amplifying transistor stage being connected to a voltage divider on the one hand, and constituting via a capacitor an input for the gating and/or modulation of calibration and test signals on the other hand. Thus the base of the voltage-amplifying transistor stage is used for the required setting of the output potential on the one hand, and for gating the required signals, such as for example, signals marking preferred crank angle positions for the piezoelectric measurement of pressure in cylinders of internal combustion engines.

Furthermore, according to the invention the load resistance of a final transistor stage in a grounded collector arrangement following a voltage-amplifying transistor stage can be designed as a frequency-compensated divider, thereby reducing the output level to zero and preserving the cutoff frequency. Amplification can be adjusted as required by any conventional device, preferably by the use of a variable resistance provided between the emitter of the final transistor stage and the base of the preceding transistor stage. When the amplifier is used for the amplification of current exclusively, capacity feedback is practicable in a manner known per se by providing a variable capacity between the output of the final transistor stage and the gate of the input stage, thereby cancelling in a manner known per se the influence of the input capacity due to long conducting cables.

Finally, it is possible to imbed all structural elements of the amplifier in a manner known per se in some kind of potting, such as silicon rubber, thereby protecting the amplifier substantially against moisture and shocks, so as to ensure smooth operation also under rough working conditions.

Figure 2:
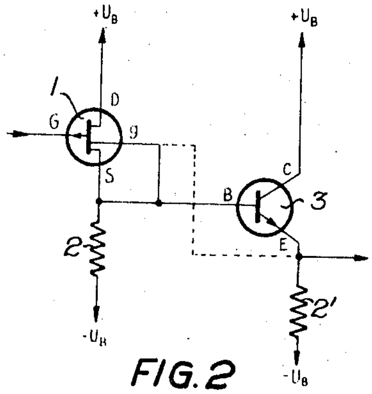
Figure 3:
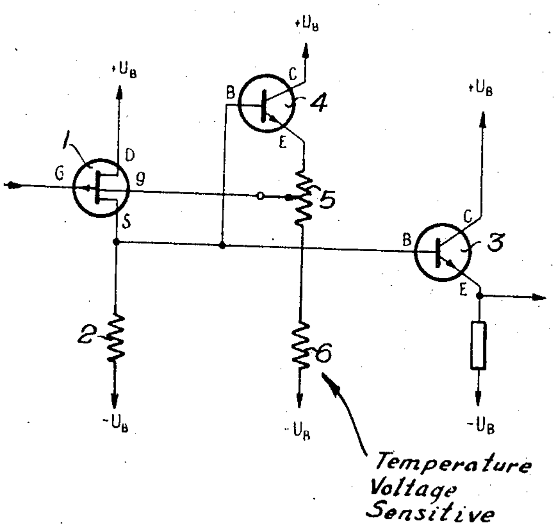
Figure 4:
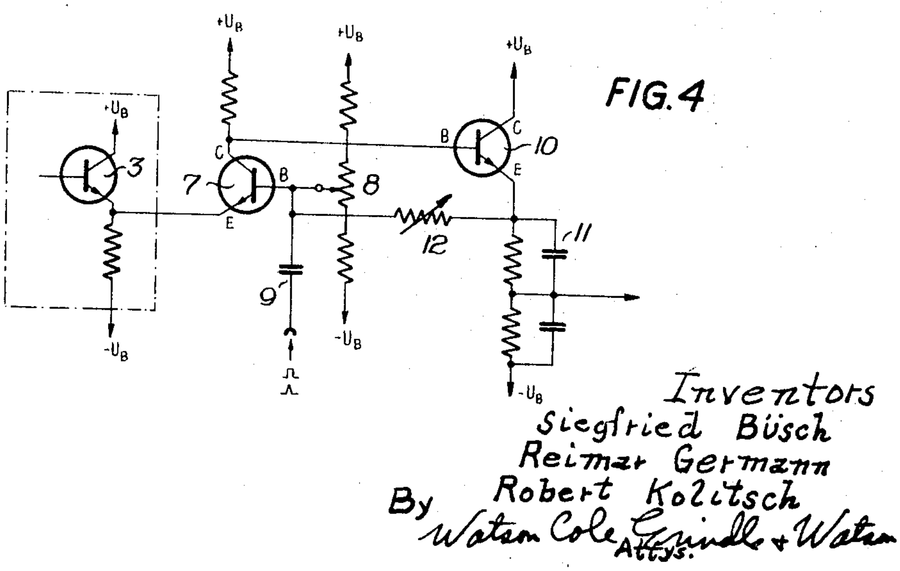
Figure 5:
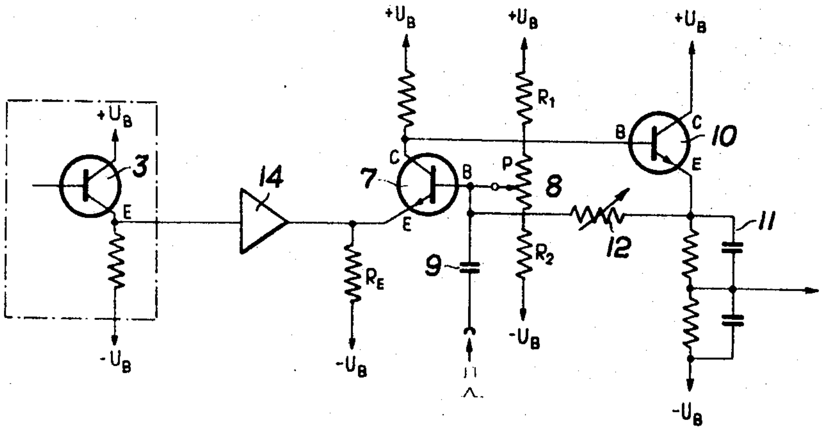

Further details of the invention will appear from the following description of several embodiments of the invention with reference to the accompanying drawings in which:

FIGS. 1, 2 and 3 show the wiring diagrams of three variants for the input stage of the amplifier according to the invention, FIG. 4 the general wiring diagram of the amplifier according to the invention, and FIG. 5 the wiring diagram of another embodiment of the invention.

In FIG. 1 the first amplified element consists of a field-effect transistor 1 comprising a load resistor 2 connected to its source electrode S. The input stage is an amplifier stage of a high input resistance, namely a transistor stage 3 following the former in a grounded collector arrangement. The drain D of the field-effect transistor 1 and the collector C of the transistor stage 3 are directly connected to the positive feed voltage $+U_B$. The two load resistors 2 and 2' of the stages 1 and 3 are connected to the negative feed voltage $-U_B$. If necessary, the load resistor 2 may be dispensed with altogether. Then the source S of the field-effect transistor is directly connected to the base B of the transistor stage 3. By this arrangement, the already high input resistance of the field-effect transistor is further increased. As appears from FIG. 2, a field-effect transistor comprising two gates is used. The second gate *g* of the field-effect transistor is either connected to the source S (full line) or to the emitter E (dotted line) of the following amplifier stage 3. With this arrangement, input resistances up to $10^{14}$ ohms can be obtained which permit static calibration of the piezoelectric gauges.

According to the embodiment of the invention illustrated in FIG. 3, the second gate *g* of the field-effect transistor 1 is connected to the controllable load resistance 5, 6 of a separator stage 4 additionally connected to the output of the field-effect transistor 1. The separator stage 4 is formed by a transistor operated in a grounded collector arrangement. The load resistance 6 is dependent on temperature and/or voltage. The controllabe load resistance 5 permits reaction-free adjustment of the operating point of the field-effect transistor 1, whereas load resistance 6 serves for the temperature and drift compensation of the amplifier.

According to FIG. 4, an emitter-coupled voltage-amplifier transistor stage 7 is connected to the transistor stage 3 of one of the arrangements shown in FIGS. 1 to 3. The transistors 3 and 7 forming a differential amplifier stage, the base of the transistor 7 being connected to a voltage divider 8 on the one hand, and forming via a capacitor 9 an input for the gating and/or modulation of calibration or test signals on the other hand. The necessary setting of the output potential of the amplifier is accomplished via the voltage divider 8. The divider 8 may also be of a multi-stage type permitting the gating of calibration leaps. By means of the following final transistor stage 10 in a grounded collector arrangement a lower output resistance is obtained, the design of the load resistance 11 of this stage as a frequency-compensated divider reducing the output level to zero and preserving the cutoff frequency. Amplification is adjusted in a manner known per se, in the example illustrated in the drawing by means of a variable resistor 12 provided between the emitter E of the transistor 10 and the base B of the transistor 7.

If the amplifier is to be used for current amplification exclusively, capacity feedback can be obtained in a manner known per se by providing a variable capacity between the output of the final transistor stage 10 and the gate G of the field-effect transistor 1, thereby suppressing the influence of the input capacity due to the considerable length of the conducting cables.

As shown in FIG. 5, the circuit of FIG. 4 may be further modified by inserting at least one grounded emitter amplifier stage 14 between stages 3 and 7.

The exclusive use of semi-conducting hardware permits accommodation of the amplifier within an extremely small space, thus making it possible for the whole amplifier assembly to be potted in a manner known per se with an appropriate sealing compound such as silicon rubber, thus providing effective protection of the amplifier against moisture and shocks.

We claim:

1. A transistorized amplifier with a high input resistance, particularly for the amplification of values measured by piezoelectric measuring instruments, comprising an input stage formed by a field-effect transistor in a grounded drain arrangement, the said field-effect transistor including insulated gates, the drain of the field-effect transistor being directly connected to the positive feed voltage, a load resistance pertaining to the said input stage connected to the source electrode of the said field-effect transistor, a second transistor stage connected to the said input stage and presenting a high input resistance, an auxiliary stage additionally connected with the base to the said input stage and formed by a transistor in a grounded collector arrangement for the purpose of compensating the temperature and drift of the input stage, said auxiliary stage including first and second load resistances, said first load resistance being connected to the second gate of the field-effect transistor, and said second load resistance being dependent on temperature and voltage.

2. An amplifier according to claim 1, comprising a voltage-amplifying transistor stage in a grounded emitter arrangement connected to the output of the second transistor stage, a voltage divider connected to the base of the said voltage-amplifying transistor stage, a capacitor connected to the base of the said voltage-amplifying transistor stage and forming an input for the gating of calibration and test signals.

3. An amplifier according to claim 1, comprising a voltage-amplifying transistor stage in a grounded emitter arrangement coupled to the output of the second transistor stage, a voltage divider connected to the base of the said voltage-amplifying transistor stage, a capacitor connected to the base of the said voltage-amplifying transistor stage and forming an input for the gating of calibration and test signals, and in which at least one additional amplifier stage is arranged between the output of the said second transistor stage and the input of the said voltage-amplifying transistor stage.

4. An amplifier according to claim 1, comprising a voltage-amplifying transistor stage in a grounded emitter arrangement connected to the output of the second transistor stage, a voltage divider connected to the base of the said voltage-amplifying transistor stage, a capacitor connected to the base of the said voltage-amplifying transistor stage and forming an input for the gating of calibration and test signals, and in which a final transistor stage in a grounded collector arrangement is connected to output of said voltage-amplifying transistor stage, and a load resistance pertaining to the said final transistor stage, the said load resistance being designed as a frequency-compensated divider.

No references cited.

ROY LAKE, *Primary Examiner.*

SIEGFRIED H. GRIMM, *Assistant Examiner.*

U.S. Cl. X.R.

307—304; 330—20, 24, 35, 38